United States Patent [19]
Ando

[11] Patent Number: 5,877,478
[45] Date of Patent: Mar. 2, 1999

[54] SEMICONDUCTOR DEVICE AND METHOD OF MANUFACTURING THE SAME

[75] Inventor: Tomoyuki Ando, Yokohama, Japan

[73] Assignee: Kabushiki Kaisha Toshiba, Kawasaki, Japan

[21] Appl. No.: 304,607

[22] Filed: Sep. 12, 1994

Related U.S. Application Data

[63] Continuation of Ser. No. 60,918, May 13, 1993, abandoned.

[30] Foreign Application Priority Data

May 14, 1992 [JP] Japan ................................. 4-148098

[51] Int. Cl.⁶ ...................... H01L 23/48; H01L 23/52; H01L 29/40; H01L 23/02
[52] U.S. Cl. .................. 257/777; 257/686; 257/685; 257/780
[58] Field of Search ................... 257/777, 778, 257/780, 781, 782, 783, 723, 724, 685, 686

[56] References Cited

U.S. PATENT DOCUMENTS 4,862,322  8/1989  Bickford et al. ................... 257/723
5,151,559  9/1992  Conru et al. ....................... 257/781

FOREIGN PATENT DOCUMENTS 61-148826  7/1986  Japan ................................ 257/777

*Primary Examiner*—Sara W. Crane
*Assistant Examiner*—S. V. Clark
*Attorney, Agent, or Firm*—Finnegan, Henderson, Farabow, Garrett & Dunner, L.L.P.

[57] ABSTRACT

A semiconductor substrate made of silicon or the like and having an active region is used as part of a package. Bumps are formed on a major surface of the semiconductor substrate. One end of each lead is connected to a corresponding bump, and the other end of the lead is located outside the major surface of the semiconductor substrate. An adhesive such as a thermoplastic resin is applied to the major surface of the semiconductor substrate. An upper substrate is located on the adhesive. The upper substrate is made of a metal plate, an insulating plate, or a semiconductor substrate. The upper substrate covers at least the active region of the semiconductor substrate, the bumps, and the lead portions on the semiconductor substrate.

9 Claims, 5 Drawing Sheets

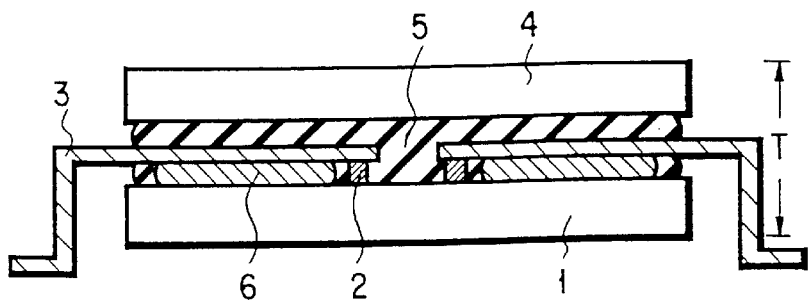
F I G. 2
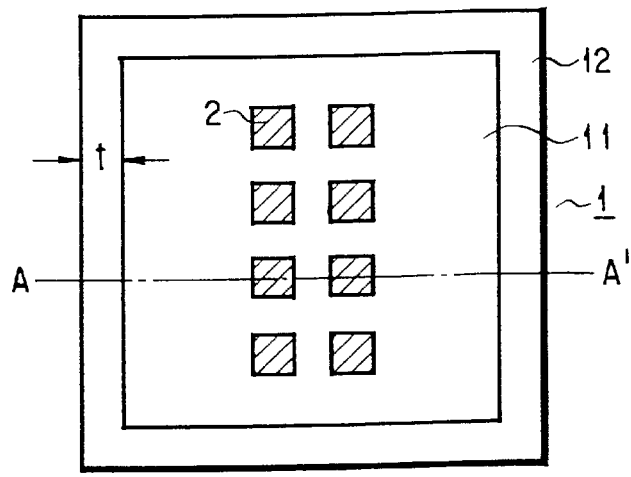
F I G. 3

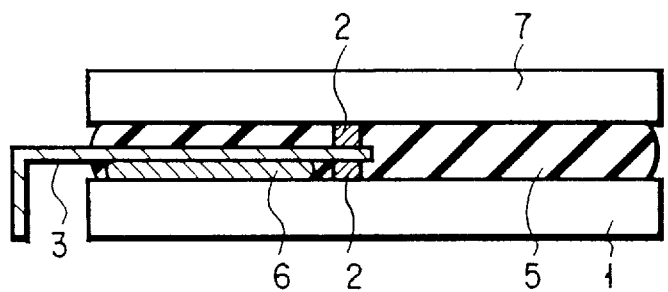
F I G. 14
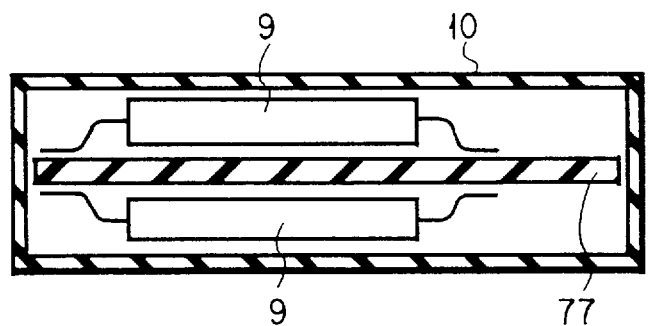
F I G. 15
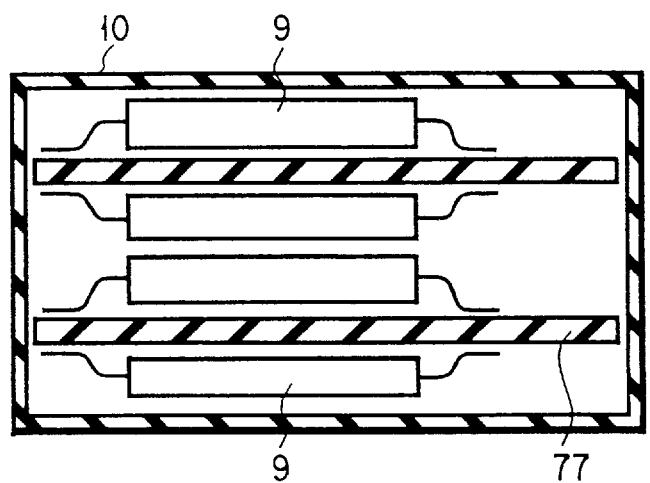
F I G. 16

SEMICONDUCTOR DEVICE AND METHOD OF MANUFACTURING THE SAME

This application is a continuation, of application Ser. No. 08/060,918 filed May 13, 1993, now abandoned.

BACKGROUND OF THE INVENTION

1. Field of the Invention

The present invention relates to a high-integration low-profile package.

2. Description of the Related Art

A semiconductor device such as an IC or LSI is packaged into a package to protect a semiconductor substrate (chip) having semiconductor elements thereon from contamination sources (e.g., dust, chemicals, gases, and humidity) and a mechanical impact. This package requires characteristics such as excellent hermetic sealing, high resistance to high temperatures during assembly, high mechanical strength, high chemical stability, excellent insulating properties, and excellent high-frequency characteristics.

The package is made of a resin material, a ceramic material, or the like. A resin package is exemplified by a DIP (Dual Inline Package) shown in FIG. 1.

This DIP will be described below.

A chip 10 is fixed on a chip mount portion 20 of a lead frame by a conductive adhesive 30. Semiconductor elements are formed in the chip 10. The chip 10 has electrode pads 60. The leads 40 are formed by part of the lead frame. One end of each bonding wire 70 is connected to a bonding portion 50 of one lead 40. The other end of the bonding wire 70 is connected to one electrode pad 60 of the chip 10. The bonding wires 70 are made of Al or Au. The chip 10, the chip mount portion 20, the bonding wires 70, and parts of the leads 40 are covered with a molding resin 80 by, e.g., a transfer mold method.

A ceramic package is exemplified by a package using a stacking method and a package using a pressure molding. The ceramic packages have an advantage in excellent hermetic sealing.

Recent packages incorporating chips are required to be compact, low-profile packages.

A memory card having a thickness of 3.3 mm, for example, must have a smaller thickness and a higher packing density in a near future. The chip size gradually increases along with the development of semiconductor devices having a higher packing density and a high integration density. Therefore, a conventional packaging method is difficult to cope with demands for compact, low-profile packages.

In the DIP shown in FIG. 1, when the thickness of the chip 10 is given to be about 0.35 mm, the minimum value of distance (i.e., the height of a semiconductor device) from the distal end (i.e., a contact portion with a circuit substrate) H of each lead 40 to the uppermost portion of the molding resin 80 which covers the chip 10 is about 1.25 mm. A thickness T of the semiconductor device is about 1.0 mm. A distance D from the chip 10 to the proximal end (i.e., a lead portion exposed from the molding resin 80) of each lead 40 is at least 1.0 mm. A length of a package is determined by adding the length of the chip 10 to a length which is twice distance D. The shortest distance from the edge of the chip 10 to each electrode pad 60 is about 0.2 mm.

It is difficult to obtain a compact, low-profile package due to the following reason.

Each bonding wire 70 which connects a bonding portion 50 of a lead 40 and a corresponding pad 60 of the chip 10 is curved having a large radius of curvature. This bonding wire 70 must be protected with the molding resin 80. In addition, the molding resin 80 must have a thickness enough to fix the leads 40. In this case, when the package size comes close to the chip size, the molding resin 80 cannot fix the leads 40, and the leads 40 may be removed from the package.

SUMMARY OF THE INVENTION

The present invention has been made to solve the conventional problems described above, and has as its object to provide a semiconductor device and a method of manufacturing the same, which can contribute to provide a compact, low-profile package realizing a high packing density.

According to the present invention, a semiconductor substrate is utilized as part of the package.

The lower surface and peripheral portion of the semiconductor substrate are used as part of the package, and the upper surface of the semiconductor substrate is covered with an upper substrate.

A semiconductor device according to the present invention comprises a major surface of a semiconductor substrate, an active region which is formed on the major surface of the semiconductor substrate and has a semiconductor element thereon, a bump formed on the major surface of the semiconductor substrate and electrically connected to the semiconductor element, a lead formed on the major surface of the semiconductor substrate and having one end connected to the bump and the other end located outside the major surface of the semiconductor substrate, an upper substrate, formed on the major surface of the semiconductor substrate, for covering at least the active region, a portion of the lead which is located on the major surface of the semiconductor substrate, and the bump, and an electrically insulating adhesive for adhering the major surface of the semiconductor substrate and the upper substrate.

Another semiconductor device according to the present invention comprises a major surface of a first semiconductor substrate, an active region formed on the major surface of the first semiconductor substrate and having a semiconductor element thereon, a first bump formed on the major surface of the first semiconductor substrate and electrically connected to the semiconductor element, a first lead formed on the major surface of the first semiconductor substrate and having one end connected to the first bump and the other end located outside the major surface of the first semiconductor substrate, a second semiconductor substrate located to have a major surface oppose the major surface of the first semiconductor substrate, an active region formed on the major surface of the second semiconductor substrate and having a semiconductor element, a second bump formed on the major surface of the second semiconductor substrate and electrically connected to the semiconductor element formed on the major surface of the second semiconductor substrate, a second lead formed on the major surface of the second semiconductor substrate and having one end connected to the second bump and the other end located outside the major surface of the second semiconductor substrate, and an electrically insulating adhesive for adhering the major surfaces of the first and second semiconductor substrates.

According to a method of manufacturing a semiconductor device according to the present invention, an active region having a semiconductor element is formed. A plurality of bumps electrically connected to the semiconductor element are formed on the major surface of the semiconductor substrate. One end of a lead is connected to each bump and the other end of the lead is located outside the major surface of the semiconductor substrate. An electrically insulating adhesive is applied to an upper substrate. The electrically insulating adhesive of the upper substrate is located on the major surface of the semiconductor substrate. The semiconductor substrate and the upper substrate are pressed against each other, and the electrically insulating adhesive is heated to bond the semiconductor substrate and the upper substrate.

According to another method of manufacturing a semiconductor device, an active region having a semiconductor element is formed on a major surface of a first semiconductor substrate. A plurality of first bumps electrically connected to the semiconductor element are formed on the major surface of the first semiconductor substrate. One end of a first lead is connected to each of the first bump, and the other end of the first lead is located outside the major surface of the first semiconductor substrate. An active region having a semiconductor element is formed on a major surface of a second semiconductor substrate. A plurality of second bumps electrically connected to the semiconductor element formed on the second semiconductor substrate are formed on the major surface of the second semiconductor substrate. One end of a second lead is connected to each of the second bumps, and the other end of the lead is located outside the major surface of the second semiconductor substrate. An electrically insulating adhesive is applied to at least one of the major surfaces of the first and second semiconductor substrates. The major surfaces of the first and second semiconductor substrates are pressed against each other, and the electrically insulating adhesive is heated to bond the major surfaces of the first and second semiconductor substrates.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a sectional view of a package according to the first embodiment of the present invention;

FIG. 3 is a plan view of a semiconductor device according to the first embodiment of the present invention;

FIG. 14 is a sectional view of a semiconductor device in FIG. 13 along the line A-A' thereof; and FIGS. 15 and 16 are sectional views showing memory cards incorporating packages of the present invention.

DETAILED DESCRIPTION OF THE PREFERRED EMBODIMENTS

Preferred embodiments of the present invention will be described with reference to FIGS. 2 to 16.

Figure 4:
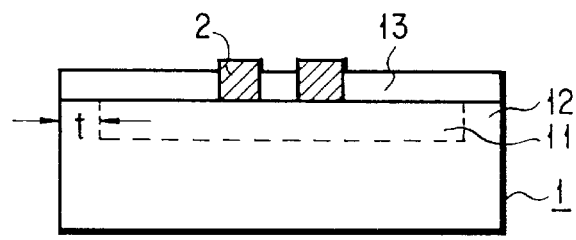
FIG. 4 is a sectional view of the semiconductor device in FIG. 3 along the line A-A' thereof.

FIGS. 2 to 4 show a TSOP (Thin Small Outline Package) according to the first embodiment. FIG. 2 is a sectional view of the TSOP, FIG. 3 is a plan view of a semiconductor according to the present invention, and FIG. 4 is a sectional view thereof along the line A-A' in FIG. 3.

A semiconductor device mounted in this TSOP is, e.g., a 16-Mbit DRAM. First of all, this semiconductor device will be described below.

A semiconductor substrate 1 is a silicon semiconductor chip having a side with a length of about 10.16 mm (400-mil width). This chip size is just an example, and the present invention is not limited to this chip size. An element region (active region) 11 is formed in the surface region of the semiconductor substrate 1. A region 12 except for the element region 11 is a region in which a semiconductor element and the like are not formed.

Portions to be protected by the package will be described below.

Semiconductor elements formed in the active region of the semiconductor substrate 1, the bumps on the semiconductor substrate 1, and the lead portions on the semiconductor substrate 1 must be protected from contamination sources (e.g., dust, chemicals, and humidity) and a mechanical impact. This protection is provided to prevent the semiconductor elements from being corroded by humidity or the like. However, the lower surface of the inactive region 12 of the semiconductor substrate 1 need not be protected.

The first embodiment will be described in detail below.

In this embodiment, the inactive region and the lower surface of the semiconductor substrate which need not be protected are used as part of the package. A new member called an upper substrate 4 is used as a package constituent element, and the active region and the bumps of the semiconductor substrate which must be protected are protected by the upper substrate 4.

The upper substrate 4 is made of a metal (e.g., a heating plate made of, e.g., Al) or an insulating ceramic material. The upper substrate 4 is adhered to the semiconductor substrate by a thermoplastic epoxy insulating adhesive 5 having a thermal expansion coefficient of about 10 to $20 \times 10^{-5}/°C$. The upper substrate 4 protects the active region on the semiconductor substrate 1, bumps 2, and portions of leads 3 on the semiconductor substrate 1. The upper substrate 4 has a size equal to that of the semiconductor substrate 1 or a size enough to cover the portions of the leads 3 on the semiconductor substrate 1, the bumps 2, and the active region 11 on the semiconductor substrate 1. When the adhesive 5 is a thermoplastic resin, no gas is produced during curing of the resin, and the characteristics of the semiconductor device are not degraded.

The active region 11 extends from the upper surface of the silicon semiconductor substrate 1 to a depth of about 5 $\mu$m therefrom. The semiconductor substrate 1 has a thickness of about 0.35 mm (350 μm). The length of one side of the semiconductor substrate 1 is, e.g., about 10.16 mm. The semiconductor substrate is, e.g., a chip obtained by dicing a circular silicon wafer. The silicon wafer is formed by slicing a cylindrical silicon ingot.

The inactive region 12 is a peripheral portion of the semiconductor substrate 1. This peripheral portion is a region pressed by a blade in wafer dicing. The inactive region 12 has a width t of about 20 to 30 μm. The inactive region 12 is used as part of the package. The upper surface of the semiconductor substrate 1 is covered with a passivation film 13 made of PSG (Phospho-Silicate Glass). The bumps 2 on the semiconductor substrate 1 are exposed from the passivation film so as to be connected to the corresponding leads 3.

Moisture permeates into the active region of the semiconductor substrate 1 through a gap formed between each bump 2 and the passivation film 13. This moisture reaches the bump 2 through the corresponding lead 3. Therefore, the distance from the position of each bump 2 to the edge of the upper substrate 4 is preferably maximized. The bumps 2 are preferably located at the central portion of the semiconductor substrate.

A method of manufacturing the TSOP according to the first embodiment will be described below.

A DRAM is formed in the active region 11 of the silicon semiconductor substrate 1 having a thickness of 0.35 μm and the length of one side of 10.16 mm. This active region is surrounded by the inactive region 12 having the width t of 20 to 30 μm. A polyimide resin is applied to the semiconductor substrate 1 to form a polyimide film 6. The polyimide film 6 serves as a lead support film used when each lead 3 is fixed to a corresponding bump 2. The polyimide film 6 is harder than the adhesive 5 and has an adhesion property.

A lead frame (not shown) is placed on the semiconductor substrate 1, and the distal end of each lead 3 is bonded to a corresponding bump 2. At this time, the polyimide film 6 keeps the lead 3 horizontal, and the lead 3 will not be broken or bent.

The thermoplastic epoxy insulating adhesive 5 is applied to the upper substrate (e.g., Al or Cu). The semiconductor substrate 1 and the upper substrate 4 are integrated such that the adhesive 5 is interposed between the semiconductor substrate 1 and the upper substrate 4. The integrated body is compressed at about 300° C. to bond the semiconductor substrate 1 and the upper substrate 4. A frame portion is cut from the lead frame. The leads 3 are bent to finish the TSOP of this embodiment.

Figure 1:
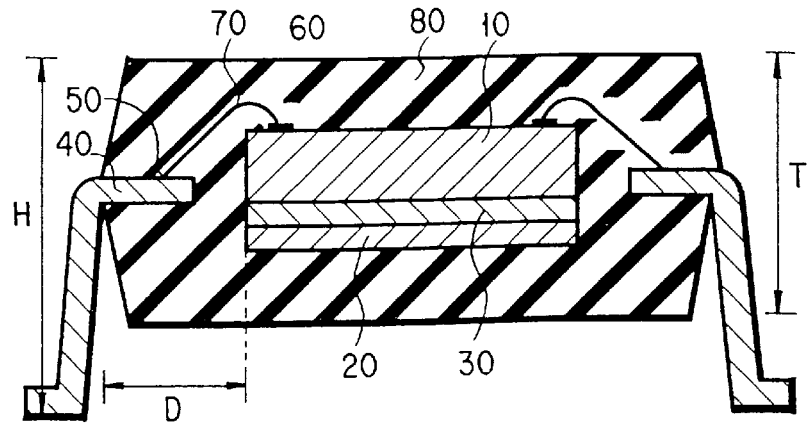
FIG. 1 is a sectional view showing a conventional package.

With the above arrangement, the package size (length× width) can be made smaller than a conventional package size. That is, the TSOP package size of the first embodiment is almost equal to the size of the semiconductor substrate 1. As compared with the conventional TSOP, a package smaller by twice the distance D in FIG. 1, i.e., about 2 mm can be provided. The thickness (height) of the package is set as follows. The thickness of the conventional TSOP is 1.0 mm. To the contrary, a thickness T of the TSOP of the first embodiment is about 0.80 mm, i.e., a sum of the thickness (0.35 mm) of the semiconductor substrate, the height (0.05 mm) of the bump, the thickness (0.15 mm) of the lead, the thickness (0.10 mm) of the adhesive and the thickness (0.15 mm) of the upper substrate.

The second embodiment will be described below.

Figure 5:
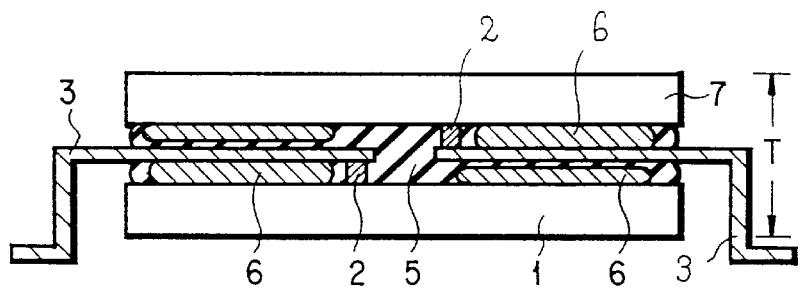
FIG. 5 is a sectional view of a package according to the second embodiment of the present invention.

FIG. 5 shows a TSOP according to the second embodiment. Unlike in the first embodiment, the second embodiment is characterized in that a silicon semiconductor substrate 7 is used in place of the upper substrate 4. In the second embodiment, a package is constituted by two silicon semiconductor substrates. The TSOP of the second embodiment has a packing density twice that of the TSOP of the first embodiment. The best effect can be obtained when the sizes of the two semiconductor substrates are equal to each other. This is not, however, any indispensable requirement of the present invention.

A method of manufacturing the package according to the second embodiment will be described below.

A polyimide resin is applied to a semiconductor substrate 1 to form a polyimide film 6. A lead frame is placed on the semiconductor substrate 1, and the distal end of each lead 3 is bonded to a corresponding bump 2. Similarly, a polyimide resin is applied to a semiconductor substrate 7 to form a polyimide film 6. A lead frame is placed on the semiconductor substrate 7, and the distal end of each lead 3 is bonded to a corresponding bump 2.

A thermoplastic epoxy insulating adhesive 5 is applied to one or both of the semiconductor substrates 1 and 7. The semiconductor substrates 1 and 7 are integrated such that the adhesive 5 is interposed between the semiconductor substrates 1 and 7. The integral body is compressed at about 300° C. to bond the semiconductor substrates 1 and 7. Finally, a frame portion of the lead frame is cut, and the leads 3 mounted on the semiconductor substrates are bent.

The leads 3 of the semiconductor substrate 1 do not overlap the leads 3 of the semiconductor substrate 7. When the leads 3 of the semiconductor substrate 1 extend from the central portion to the right side of the semiconductor substrate 1, the leads 3 of the semiconductor substrate 7 extend from the central portion to the left side of the semiconductor substrate 7.

With the above arrangement, the package size (length× width) can be made smaller than a conventional package size. That is, the TSOP package size of the second embodiment is almost equal to the size of the semiconductor substrate 1. As compared with the conventional TSOP, a package smaller by twice the distance D in FIG. 1, i.e., about 2 mm can be provided. The thickness (height) of the package is set as follows. The thickness of the conventional TSOP is 1.0 mm. To the contrary, a thickness T of the TSOP of the second embodiment is about 0.80 mm, i.e., a sum of the thickness (0.35 mm) of one semiconductor substrate, the height (0.05 mm) of the bump, the thickness (0.15 mm) of the lead, the thickness (0.10 mm) of the adhesive, and the thickness (0.15 mm) of the other semiconductor substrate.

With the above arrangement, since the two semiconductor substrates are used, the packing density can be doubled as compared with the conventional case. In the second embodiment, a memory as a device is formed on each semiconductor substrate.

A package according to the third embodiment will be described below.

Figure 6:
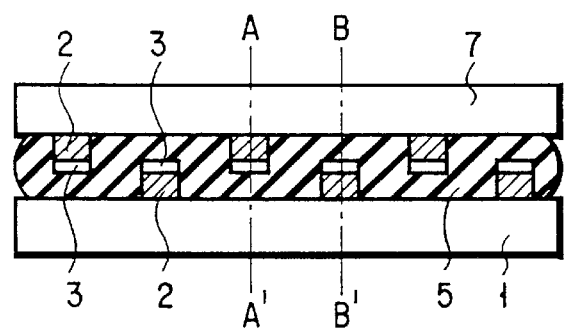
FIGS. 6 to 8 are sectional views of a package according to the third embodiment of the present invention.
Figure 7:
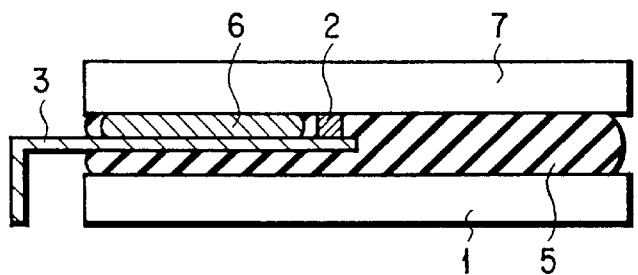
Figure 8:
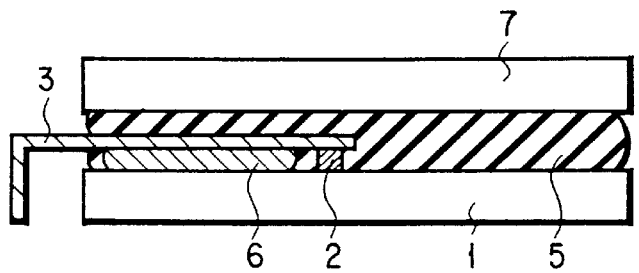

FIGS. 6 to 8 show an SVP (Surface Vertical Package) according to the third embodiment. FIG. 6 is a sectional view of the SAP of this embodiment, FIG. 7 is a sectional view thereof along the line A-A' of FIG. 6, and FIG. 8 is a sectional view thereof along the line B-B' in FIG. 6.

This embodiment is characterized in the layout of leads connected to corresponding bumps. A package is constituted by two silicon semiconductor substrates 1 and 7, as in the second embodiment. Leads 3 of the semiconductor substrate 1 are staggered from leads 3 of the semiconductor substrate 7. The leads 3 of the semiconductor substrate 1 extend in the same direction as that of the leads 3 of the semiconductor substrate 7.

With the above arrangement, the packing density is doubled as compared with the conventional SVP as in the second embodiment. Although the thickness of the conventional SVP is 1.2 mm, the thickness of the SVP type package of the third embodiment is 1.0 mm.

A package according to the fourth embodiment will be described below.

Figure 9:
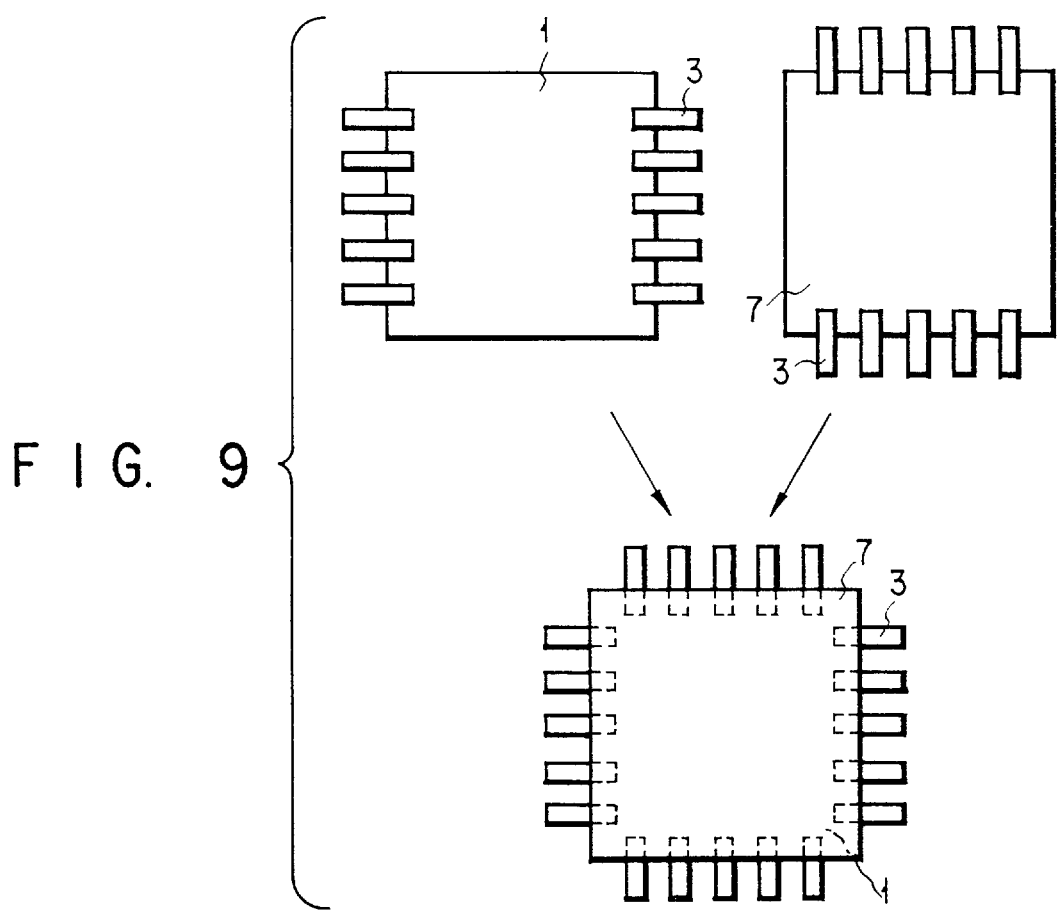
FIG. 9 is a plan view showing the main part of a package according to the fourth embodiment of the present invention.

FIG. 9 shows a TQFP (Thin Quad Flat Package) or QFP package according to the fourth embodiment.

This embodiment is characterized in the layout of leads mounted in semiconductor substrates 1 and 7. This package is a quad flat package in which leads 3 extend from the respective sides of the package in four directions.

This package is constituted by the two semiconductor substrates 1 and 7. The leads 3 of the semiconductor substrate 1 are formed at two opposite sides (right and left sides). The leads 3 of the semiconductor substrate 7 are formed at the remaining two opposite sides (upper and lower sides).

A thermoplastic insulating adhesive is applied to one or both of the semiconductor substrates 1 and 7. The two substrates are pressed against each other and heated such that the lead formation surfaces contact each other. The leads 3 of the semiconductor substrate 1 do not overlap the leads 3 of the semiconductor substrate 7. The resultant package has a thickness of 1.0 mm, and the packing density of the package is twice that of the conventional package.

A package according to the fifth embodiment will be described below.

Figure 10:
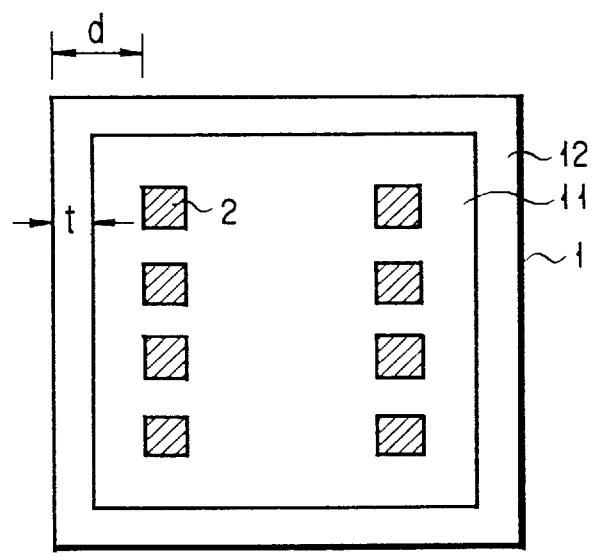
FIG. 10 is a plan view showing the main part of a package according to the fifth embodiment of the present invention.
Figure 11:
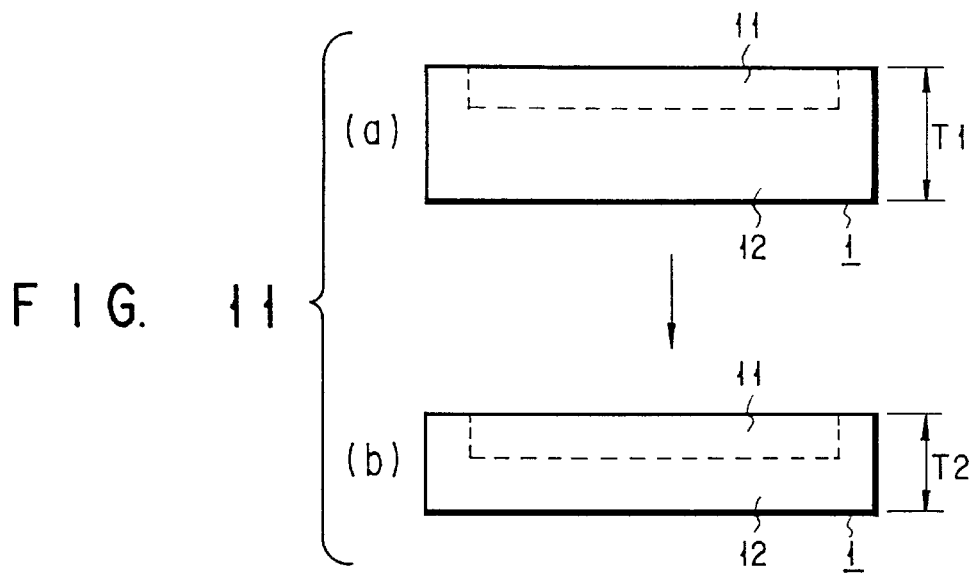
FIGS. 11(a) and (b) are sectional views of a conventional semiconductor substrate and a semiconductor substrate constituting a package according to the sixth embodiment of the present invention.

FIG. 10 shows the package according to the fifth embodiment. This embodiment is characterized in the layout of bumps formed on a semiconductor substrate.

The layouts of leads and bumps influence functions of the package of the present invention. In the first embodiment described above, the bumps are located at the central portion of the semiconductor substrate. However, when the bumps are formed at the central portion of the semiconductor substrate, the resultant package is not suitable for extending the leads from all of the four sides.

This embodiment provides the layout of bumps to allow extension of leads from all of the four sides of a package without impairing package functions.

A distance d from one side of a semiconductor substrate to each bump 2 of the corresponding array is set to be larger than 1.2 mm. The contact distance between each lead and the semiconductor substrate 1 is larger than 1.2 mm. This package therefore has high resistance to humidity and high strength. This embodiment can be applied to the first to fourth embodiments described above.

With this arrangement, an area capable of forming semiconductor elements can be increased in an active region 11. That is, of the active region 11, a region from one side of the semiconductor substrate to the bumps 2 of the corresponding array generally does not have any semiconductor elements. In this embodiment, however, the distance from one side of the semiconductor substrate to the bumps 2 of the corresponding array is minimized, so that the area capable of forming semiconductor elements can be increased.

A package according to the sixth embodiment will be described below.

FIGS. 11(a) and 11(b) show a substrate used in a conventional package and a semiconductor substrate constituting part of a package of the sixth embodiment, respectively.

In the conventional package using a molding resin, the resin and the semiconductor substrate have a difference in thermal expansion coefficient, and a stress acts on the semiconductor substrate. To prevent changes in characteristics of a semiconductor device (LSI) due to this stress, a thickness T1 of the semiconductor substrate must be 0.35 mm or more.

To the contrary, according to the present invention, since a peripheral portion (i.e., a portion of an inactive region 12) of a semiconductor substrate 1 is used as part of the package, no molding resin is used. The stress acting on the semiconductor substrate need not be taken into consideration. A thickness T2 of the semiconductor substrate 1 can be set to be about 0.25 mm, and the depth of an active region 11 is about 5 $\mu$m.

A package according to the seventh embodiment will be described below.

Figure 12:
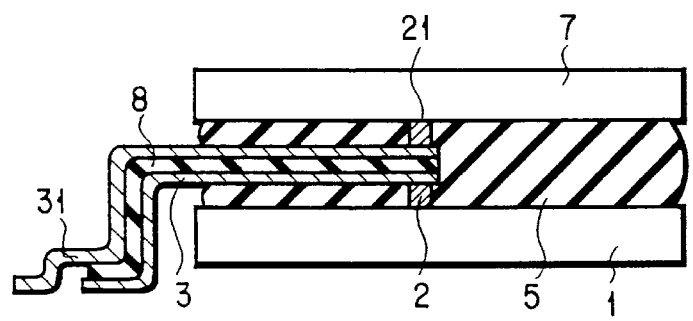
FIG. 12 is a sectional view of a package according to the seventh embodiment of the present invention.

FIG. 12 shows the package according to the seventh embodiment.

The package of this embodiment is constituted by two semiconductor substrates. A lead 3 connected to a corresponding bump 2 of a semiconductor substrate 1 overlaps a lead 31 connected to a corresponding bump 21 of a semiconductor substrate 7. The lead 3 is insulated form the corresponding lead 31 by an adhesive 8. The adhesive 8 is a thermoplastic epoxy insulating adhesive. The leads 3 and 31 are bent, so that the package can be easily mounted on a circuit board. The number of bent portions of the lead 31 is larger than that of the lead 3 to prevent the lead 31 from being brought into contact with the lead 3. In this embodiment, the leads can be arranged at a high density.

A package according to the eighth embodiment will be described below.

Figure 13:
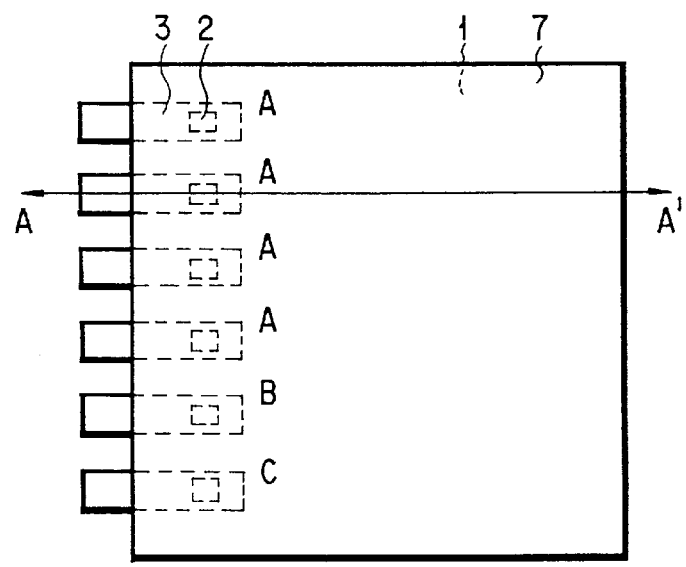
FIG. 13 is a plan view showing the main part of a package according to the eighth embodiment of the present invention.

FIGS. 13 and 14 show an SVP package according to the eighth embodiment. FIG. 13 is a plan view of the SVP package, and FIG. 14 is a sectional view thereof along the line A-A' thereof.

Each lead 3 is generally connected to a corresponding bump of one of semiconductor substrates 1 and 7. For example, of all the leads 3, a lead B is connected to a corresponding bump 2 of the semiconductor substrate 7. Of all the leads 3, a lead C is connected to a corresponding bump 2 of the semiconductor substrate 1.

In this embodiment, of all the leads 3, leads A are connected to the corresponding bumps 2 of both the semiconductor substrates 1 and 7. In this embodiment, the bumps of the semiconductor substrates 1 and 7 are connected to, e.g., data lines or I/O lines.

Memory cards according to the ninth embodiment will be described below.

FIGS. 15 and 16 respectively show memory cards according to the ninth embodiment. FIG. 15 shows the memory card in which packages 9 of the present invention are mounted on both surfaces of a circuit board, and FIG. 16 shows a memory card in which two circuit boards are arranged, and packages 9 are mounted on the two surfaces of each circuit board.

The height of the package 9 is about 1.25 mm. The height of the memory card shown in FIG. 15 is about 3.3 mm. The entire surface of the package can be coated with a silicon oxide film. Each package may be partially covered with an insulating material, and contact between the packages can be prevented. This facilitates mounting of the packages 9 on a circuit board 77.

In each of the first to ninth embodiments described above, a semiconductor substrate constituting part of a package is a silicon substrate. However, a GaAs substrate may be used in place of the silicon substrate. The semiconductor substrate is not limited to a semiconductor substrate for a memory, but can be a semiconductor substrate for a logic circuit. A package of the present invention may be constituted by a semiconductor substrate having a circuit having excellent heat dissipation performance, and a heat dissipation body such as a heat sink may be attached to the package. Even if a package is constituted by a combination of a semiconductor substrate having no heat dissipation property and a semiconductor substrate having a heat dissipation property, the semiconductor substrate having no heat dissipation property is not adversely affected because these two semiconductor substrates are kept separated from each other.

In the first embodiment, the upper substrate may be a metal plate such as Al or Cu, or may be made of a material such as alumina, beryllia, forsterite, steatite, cordierite, "Pyroceram", or aluminum nitride.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:

a first semiconductor substrate having a major surface of rectangular shape with consecutive first, second, third, and fourth sides;

an active region within said major surface of said first semiconductor substrate;

a plurality of first bumps formed on said major surface of said first semiconductor substrate;

a plurality of first leads formed on said major surface of said first semiconductor substrate and each having one end connected to only one of said first bumps and another end located outside said major surface of said first semiconductor substrate;

a second semiconductor substrate having a major surface of rectangular shape with consecutive first, second, third, and fourth sides and located to oppose said major surface of said first semiconductor substrate;

an active region within the major surface of said second semiconductor substrate;

a plurality of second bumps formed on said major surface of said second semiconductor substrate;

a plurality of second leads formed on said major surface of said second semiconductor substrate and each having one end connected to only one of said second bumps and the other end located outside said major surface of said second semiconductor substrate; and an electrically insulating adhesive for adhering said major surfaces of said first and second semiconductor substrates, said first and second leads being insulated from each other when the major surface of the first semiconductor substrate and the major surface of the second semiconductor substrate are adhered to each other;

said first semiconductor substrate and said second semiconductor substrate overlapping each other so that, when said major surface of said first semiconductor substrate and said major surface of said second semiconductor substrate are adhered to each other by said electrically insulating adhesive, said first leads and said second leads are offset laterally relative to each other in a direction parallel to the first sides of the semiconductor substrates so as to avoid overlapping each other, said first side of said first semiconductor substrate is vertically aligned with said first side of said second semiconductor substrate, and the other end of each of said first and second leads is located on the first side of said first and second semiconductor substrates.

2. A device according to claim 1, further comprising a lead support film, formed between each of said first leads and said major surface of said first semiconductor substrate, for fixing said first leads.

3. A device according to claim 1, further comprising a lead support film, formed between each of said second leads and said major surface of said second semiconductor substrate, for fixing said second leads.

4. A device according to claim 2, wherein the lead support film is a polyimide film.

5. A device according to claim 1, wherein said first bumps are formed at a position spaced apart from one side of said first semiconductor substrate by at least 1.2 mm.

6. A device according to claim 1, wherein said second bumps are formed at a position spaced apart from one side of said second semiconductor substrate by at least 1.2 mm.

7. A device according to claim 1, wherein said first leads and second leads avoid overlapping each other.

8. A device according to claim 1, wherein said first leads and second leads overlap each other.

9. A device according to claim 3, wherein the lead support film is a polyimide film.

* * * * *